United States Patent
Bergman et al.

(10) Patent No.: US 6,488,038 B1
(45) Date of Patent: Dec. 3, 2002

(54) METHOD FOR CLEANING SEMICONDUCTOR SUBSTRATES

(75) Inventors: Eric J. Bergman, Kalispell, MT (US);
Craig P. Meuchel, Kalispell, MT (US);
Ian Sharp, Kalispell, MT (US)

(73) Assignee: Semitool, Inc., Kalispell, MT (US)

( * ) Notice: Subject to any disclaimer, the term of this patent is extended or adjusted under 35 U.S.C. 154(b) by 74 days.

(21) Appl. No.: 09/707,244

(22) Filed: Nov. 6, 2000

(51) Int. Cl.[7] .............................. C25F 3/04; B08B 3/02; B08B 3/04; B08B 3/10
(52) U.S. Cl. .................... 134/1.3; 510/175; 510/176; 510/177; 438/697; 438/745; 438/770
(58) Field of Search .................. 117/95; 118/715; 134/1.3, 3; 204/192.15; 216/48; 257/296; 427/248.1; 438/149, 151, 240, 289, 398, 624, 697, 699, 770, 778, 745; 510/175, 176, 177

(56) References Cited

U.S. PATENT DOCUMENTS

| | | | |
|---|---|---|---|
| 5,712,198 A | * | 1/1998 | Shive et al. |
| 5,725,753 A | * | 3/1998 | Harada et al. |
| 5,783,790 A | * | 7/1998 | Mitsumori et al. |
| 5,882,425 A | | 3/1999 | Graham |

FOREIGN PATENT DOCUMENTS

| | | | |
|---|---|---|---|
| JP | 07055159 A | * | 8/1993 |
| JP | 10125939 A | * | 5/1998 |

* cited by examiner

*Primary Examiner*—Gregory E. Webb
(74) *Attorney, Agent, or Firm*—Perkins Coie LLP

(57) ABSTRACT

A method and apparatus for cleaning organic material from a semiconductor substrate suppresses the oxidation of a conductive film or layer on the substrate. A semiconductor substrate is immersed within a bath of water. The conductive layer is contacted to a source of electrons. The electrons form a floating charge protecting the conductive layer from oxidation. Ozone gas is introduced into the water bath. In another aspect, the semiconductor substrate is sprayed with water. Organic contaminants or films are oxidized and removed by the ozone, while the conductive or metal layer is preserved. An anode may be placed adjacent to the surface of the semiconductor substrate to passivate the metal layer via current flow.

12 Claims, 3 Drawing Sheets ated along with the organic contaminants. Some metals such as aluminum, when oxidized, form a "hard" oxide. A hard oxide is an inert, continuous oxide film, which prevents further reaction of the metallic film beyond the surface layer. Other metals such as copper, form a non-passivating oxide, such as CuO. CuO is a black material that is loosely bonded to the reactive copper surface. Thus, as CuO forms on the surface of a semiconductor substrate, it spalls off the surface of the substrate, thereby exposing a fresh layer of Cu that is available for further oxidation.

US 6,488,038 B1

METHOD FOR CLEANING SEMICONDUCTOR SUBSTRATES

FIELD OF THE INVENTION

The field of the invention is methods and apparatus for cleaning semiconductor substrates.

BACKGROUND OF THE INVENTION

During the processing of semiconductor substrates into completed electronic devices such as integrated circuits, microprocessors, or memory chips, it is necessary to clean the semiconductor substrates to remove organic material particle or film contaminants on the surface of the semiconductor substrate. Contaminants that are not removed during the cleaning step reduce the overall yield of the manufacturing process thus reducing the number of useable electronic devices, that can be obtained from a given semiconductor substrate. Contamination is increasingly important in current semiconductor processes, where an increasing number of ever smaller components are placed on a given area of the semiconductor substrate.

The removal of organic materials from semiconductor substrates has generally been accomplished through an oxidation process, in which organic contaminants are either converted completely to $CO_2$ and water, or through partial oxidation, which will disrupt the polymer matrix and facilitate the bulk removal of the contaminating film or layer. One technique for removing organic contaminants uses ozone and deionized (DI) water. This technique can be illustrated in the following chemical reaction:

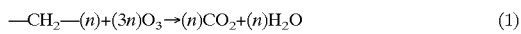

$$—CH_2—(n)+(3n)O_3 \rightarrow (n)CO_2+(n)H_2O \quad (1)$$

The use of ozone in DI water, as represented by the above-reaction, has been successfully applied to remove many types of organic contamination, including photoresist films. Other methods of removing organic contaminants from semiconductor substrates have included use of sulfuric acid with hydrogen peroxide and/or ozone. However, use of the ozone and DI water reaction provides cost and environmental benefits over the acid-based removal method. Recent advances in ozone and DI water photoresist stripping have improved the strip rate and performance characteristics of the removal method, making the ozone/DI water method highly competitive with acid-based removal methods.

One of the major limitations of any oxidative cleaning process, including the ozone/DI water method, is that it has limited application on metal films or layers, as many metals will be oxid Consequently, methods for cleaning semiconductor substrates having metal layers often require use of organic-based solvents that dissolve the organic contaminants, rather than oxidizing them. However, organic-based solvents are very expensive and increase the cost of the cleaning process. In addition, organic-based solvents generally create health and environmental concerns.

Difficulties in removing organic contaminants are of special concern with semiconductor substrates that have a surface film or layer of copper (Cu). Electroplated Cu is now being used to provide the interconnect layers on semiconductor wafers. Due to the smaller sizes of the electronic devices formed on the semiconductor substrates, it is becoming increasingly important to remove even smaller contaminants, including organic contaminants, from the semiconductor substrate surface. However, ozone/DI water cleaning is not suitable for semiconductor substrates containing a Cu film or other metal layer subject to oxidation during cleaning.

Thus, there is a need for an improved semiconductor substrate cleaning method. There is also a need for method that suppresses or eliminates the oxidation of conductive films on semiconductor substrates.

SUMMARY OF THE INVENTION

In a first aspect of the invention, a method is provided for cleaning organic material from a semiconductor substrate, wherein the semiconductor substrate includes an electrically conductive layer or surface. The semiconductor substrate is immersed in water. The conductive layer is supplied with electrons. Ozone gas is introduced into to the water. This passivates the conductive layer and promotes cleaning. Typically, the conductive layer or surface is a metal, such as copper. The conductive surface may be continuous, such as a plated but not etched substrate, or it may be discontinuous, in the form of pads, runs, vias, etc.

In a second aspect of the invention, the method includes the steps of spraying the semiconductor substrate with water, connecting the conductive layer or surface to a source of electrons, and providing ozone gas to the conductive layer.

In another aspect of the invention, an apparatus for suppressing the oxidation of a conductive layer or surface on a semiconductor substrate, includes a fixture for holding the substrate, a bath of fluid (typically water), ozone gas within the fluid bath, and a source of electrons electrically connected to the conductive layer.

In still another aspect of the invention, an apparatus for suppressing the oxidation of a conductive surface on a semiconductor substrate, includes a fixture for holding the substrate, a sprayer for spraying a fluid, such as water, onto the conductive surface, an ozone gas source, and a source of electrons electrically connected to the conductive surface or section of the semiconductor substrate.

In still another aspect of the invention, a method of cleaning organic material from a semiconductor substrate includes the steps of immersing the semiconductor substrate in water, contacting the conductive film to a cathode of a DC electrical power source (such as a DC power supply or a battery), preferably placing an anode of the DC electrical source adjacent to the surface of the semiconductor substrate, and providing ozone gas into the water.

In yet another aspect of the invention a method of cleaning organic material from a semiconductor substrate having any conductive metal surface areas, includes the steps of spraying the metal surfaces with water, connecting the metal surface areas to a cathode of a DC electrical source, optionally placing an anode of the DC electrical source adjacent to the surface of the metal areas, and providing ozone gas around the metal areas.

In another aspect of the invention, an apparatus for suppressing the oxidation of a conductive film on a semiconductor substrate includes a fixture for holding the semiconductor substrate, a water bath, a supply of ozone gas, and a cathode of a DC electrical power source electrically connected to the conductive film. The anode of the DC electrical power source is positioned adjacent to the surface of the semiconductor substrate including the conductive film thereon.

In another aspect of the invention, a device for suppressing the oxidation of a conductive film contained on a semiconductor substrate includes a fixture, for holding the semiconductor substrate, a sprayer for spraying water onto the semiconductor substrate, a supply of ozone gas, a cathode of a DC electrical power source electrically connected to the conductive film of the semiconductor substrate. The anode of the DC electrical source is positioned adjacent to the surface of the semiconductor substrate including the conductive film thereon.

Accordingly, it is an object of the invention to provide improved methods and devices for cleaning a semiconductor substrate. It is a further object of the invention to provide methods and apparatus for suppressing oxidation of conductive films on semiconductor substrates. Other objects and advantages will appear below.

The invention resides not only in the combinations described above, but also in subcombinations of them.

DETAILED DESCRIPTION OF THE PREFERRED EMBODIMENTS

Figure 1:
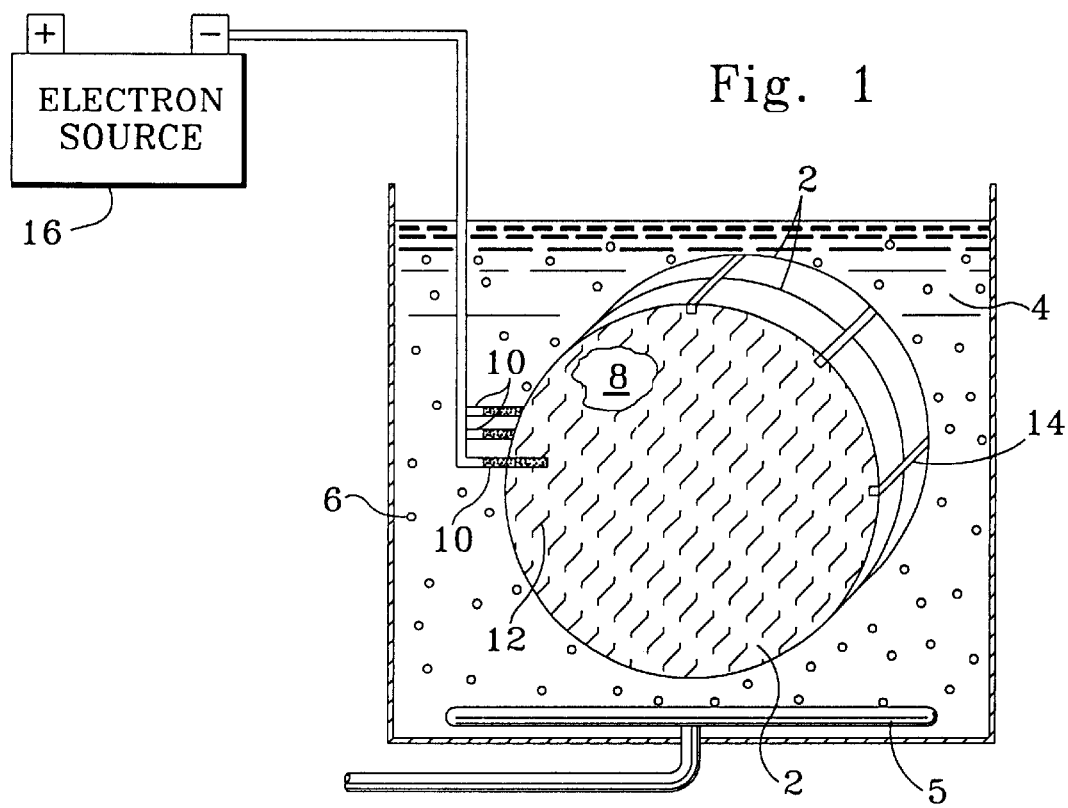
FIG. 1 schematically illustrates a plurality of semiconductor substrates immersed in a bath of DI water.

Referring to FIG. 1, a semiconductor substrate 2 is immersed in a bath containing DI water 4, possibly including one or more chemical additives including corrosion inhibitors, conductive salts and additives to enhance cleaning. Ozone gas 6 is bubbled through the DI water bath 4, via an ozone manifold 5 connected to an ozone gas source. The ozone gas bubbles contact the substrate 2 along with ozone dissolved in the liquid. The ozone gas 6 reacts with organic contamination 8 on the semiconductor substrate 2. (The organic contamination 8 in the figures, as well as other features shown, are not to scale. The figures schematically illustrate the preferred embodiments, and are not intended to show actual sizes, proportions, or relationships.) The ozone 6 partially, or entirely, oxidizes the organic contamination 8. Partial oxidation aids in disrupting the polymer matrix, thereby aiding in the removal of organic contamination 8.

While the present methods and apparatus are especially useful for cleaning semiconductor substrates, such as a silicon wafers, they are also useful for any other articles having conductive or metal layers, such as electronic or optical devices, glass or quartz substrates having metal layers, etc. As used herein, substrate or semiconductor substrate encompasses all such articles.

Figure 4:
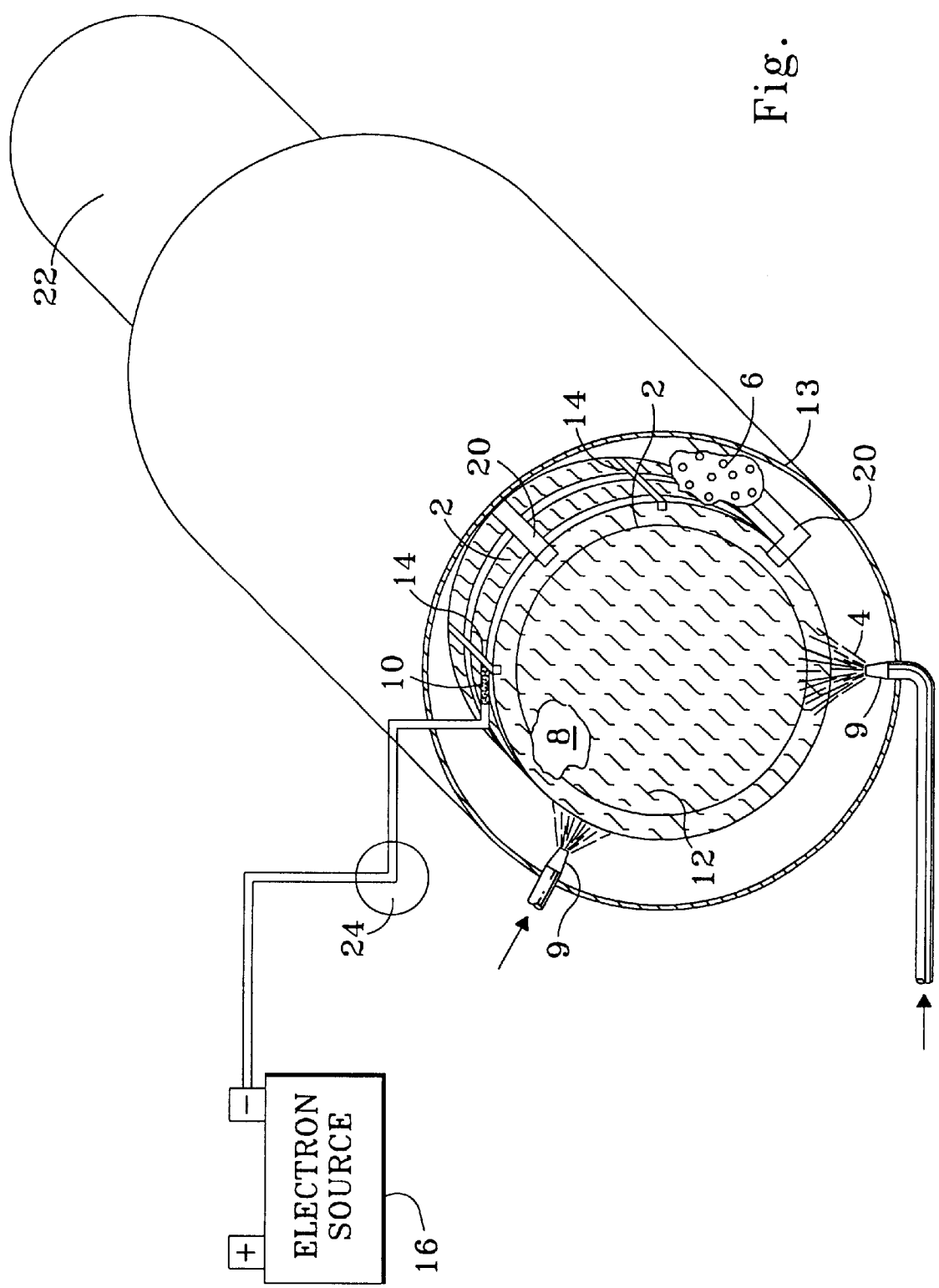
FIG. 4 schematically illustrates a semiconductor substrate in a spray chamber.

As an alternative to the immersion of the semiconductor substrate 2 in the DI water bath 4, and as shown in FIG. 4, the semiconductor substrate 2 may be sprayed with DI water via one or more nozzles or spray heads 9. The semiconductor substrate 2 is contained within a spray chamber 13 containing ozone gas 6. In the immersion mode and the spray mode, the semiconductor substrate 2 can be rotated about its axis to aid in the cleaning process.

Figure 2:
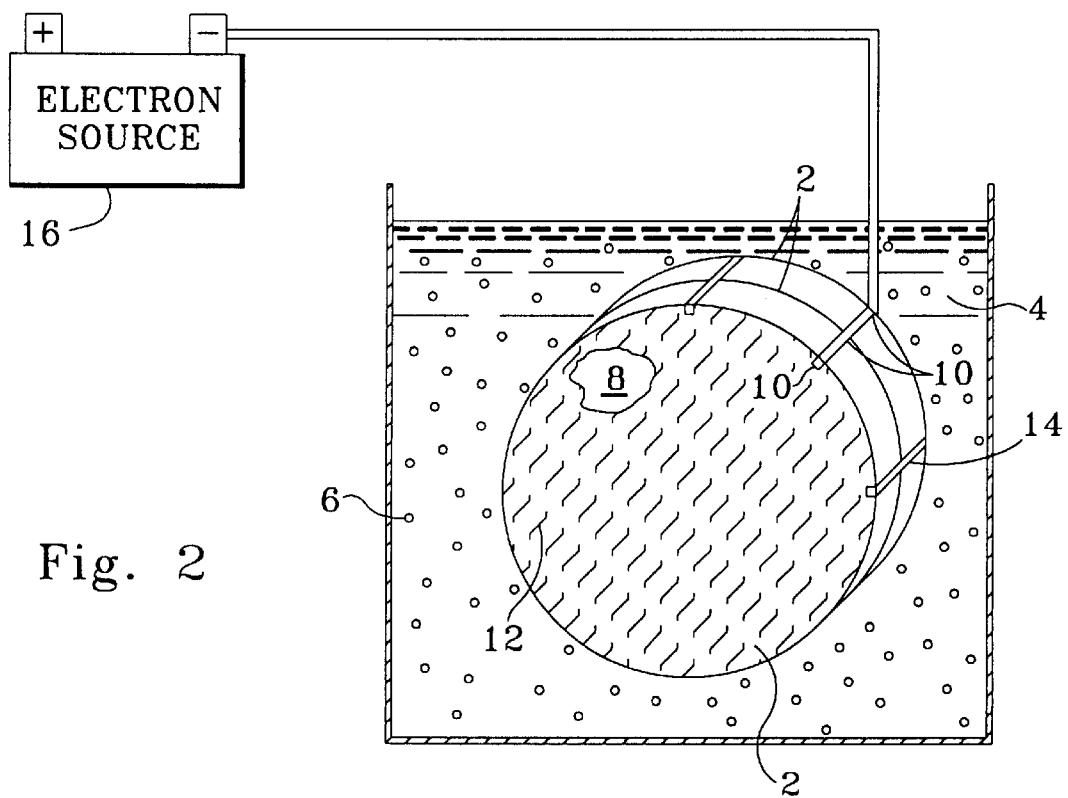
FIG. 2 schematically illustrates another view of a plurality of semiconductor substrates immersed in a bath of DI water.

An electrical contact 10 is in electrical communication with a metal or conductive film or surface 12 on the semiconductor substrate 2. The electrical contact 10 may contact the conductive film 12 directly (as shown in FIG. 1) or, alternatively, the electrical contact 10 may contact a fixture 14, which in turn, contacts the conductive film 12, as shown in FIG. 4. If more than one semiconductor substrate 2 is processed, each semiconductor substrate 2 is preferably connected to one or more electrical contacts 10. The fixture 14 may act as one common electrical contact 10 to each semiconductor substrate 2, for example, as shown in FIG. 2.

In methods where the substrate is rotated, in a rotor 20 driven by a spin motor 22, such as in FIG. 4, electrical connections to the fixture 14 are made via slip rings or brushes 24. Apparatus for spinning the substrate, as described in U.S. Pat. Nos. 5,544,421; 5,573,023; 5,784,797; and U.S. patent application Ser. No. 09/437,711; incorporated herein by reference, may be modified to provide the electrical connections, as described above, to practice the methods of the invention.

The portion of electrical contact 10 not connected to the conductive film 12, i.e., the opposite end is connected to an electron source 16. Preferably, the electron source 16 is the cathode (negative terminal) of a DC electrical power supply, or battery. The electron source 16 supplies electrons to the conductive film 12. In the absence of a conductive path to an anode (positive terminal), the surface of the semiconductor substrate 2 will obtain what is generally referred to as a "floating charge." Essentially, the semiconductor substrate 2 becomes one plate of an infinite capacitor, capable of storing vast numbers of electrons.

In the absence of a true current path, electron transfer or discharge occurs when a reactive species comes into contact with the surface of the semiconductor substrate 2. Instead of obtaining electrons from the conductive film 12, and thereby oxidizing the conductive film 12 (i.e. oxidizing the metal, such as cooper), electrons are provided from the "floating charge" on the substrate surface. The lost electrons are immediately replenished from the electron source 16.

By making an electrical contact 10 with a semiconductor substrate 2 and supplying a replenishible quantity of electrons to the surface of the semiconductor substrate 2 having a conductive (e.g., metallic) film 12, the metallic or conductive film 12 is passivated. Using Cu as an example, the half-cell reaction is:

$$Cu^o \rightarrow Cu^{+2} + 2e^- (-.34 \text{ eV}) \tag{2}$$

The conversion of copper metal ($Cu^o$) to copper 11 oxide ($Cu^{-2}$) requires a change in the oxidation state of Cu through the transfer of electrons. If electrons are available from a source that "gives up" electrons more readily, electrons will transfer to the reactive species from the source rather than the copper metal. In this method, the electron source 16 gives up electrons more easily than the copper metal film 12. The copper metal is thus effectively shielded from oxidation.

The methods can be used with various conductive films, areas, and layers 12 Copper is described here as but one example.

Figure 3:
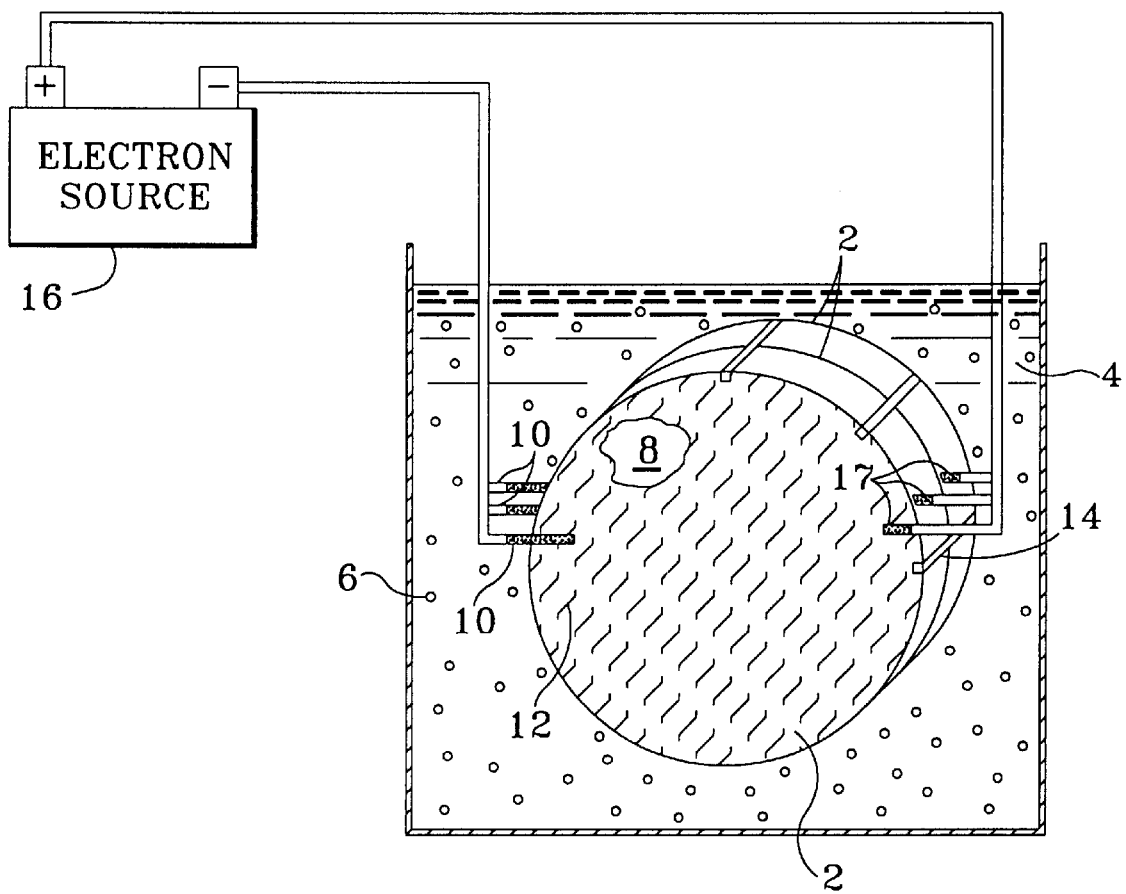
FIG. 3 schematically illustrates a plurality of semiconductor substrates immersed in a bath of DI water with anodes placed adjacent to the surface of the semiconductor substrates.

As shown in FIG. 3, an anode 17 (positive terminal) may be provided adjacent to the semiconductor substrate 2. When an anode 17 is employed, an electrolyte is added to the DI water to permit current to flow from the semiconductor substrate 2 to the anode 17. Passivation of the conductive layer 12 occurs not through a floating charge, but through current flow. Regardless of the method of passivation, i.e., floating charge or current flow, the conductive layer 12 is protected from oxidation.

During processing of the semiconductor substrate 2, DI water 4 and ozone 6 contact the semiconductor substrate 2. The non-conducting or insulating organic contamination film or particles 8 are oxidized, while the metal or conductive film 12 remains un-oxidized.

It is also possible to use this method to enhance and aid in other cleaning applications such as particle removal. By charging a surface of a semiconductor substrate 2, a repulsive field is generated that can repel charged particles and the like that are at or near the surface of the semiconductor substrate 2. Chemical cleaning techniques remove contaminant particles. The applied charge helps to prevent the re-deposition of particles or other contaminants oh the surface. For back-side particle removal during manufacturing, metalization of the back-side with a chemically inert metal such as platinum, permits charging to promote cleaning.

In another aspect of the invention, a non-conductive surface of a semiconductor substrate 2 is passivated by creating a surface static charge. As the electrons are depleted due to bleed-off and reaction, a cathode, i.e., an electron source 16 is used to replenish electrons. Preferably, the zeta potential on specific surfaces of the semiconductor substrate 2 is altered and controlled for different chemical environments, to minimize adhesion of contaminants to the surface of the semiconductor substrate 2.

EXAMPLES

Experimental tests were performed to confirm the feasibility of using the method for suppressing oxidation of the conductive film 12 of a Cu plated semiconductor substrate 2. A semiconductor substrate 2 in the shape of a wafer with approximately 1 micron of highly polished copper was placed in a beaker of DI water 4 in which ozone gas 6 was bubbled at a rate of approximately 4 liters per minute and a concentration of about 360 grams of ozone per cubic meter of oxygen feed gas. After approximately 10 minutes, the semiconductor substrate 2 was removed from the DI water 4 and inspected visually and under a microscope. Significant corrosion was noted, along with the formation of the black CuO compound, which was evident on the surface of the semiconductor substrate 2 and dispersed in the DI water 4.

Next, a similar semiconductor substrate 2 was placed in a beaker of DI water 4 into which ozone gas 6 was bubbled. The same experimental conditions used in the previous experiment were employed except that the semiconductor substrate 2 was connected via an alligator clip to the cathode (negative terminal) an 18 volt DC transformer. After approximately thirty minutes, the semiconductor substrate 2 was removed from the DI water 4 and inspected visually and under a microscope. No significant corrosion was seen, and there was no evidence of CuO residue being suspended in the DI water 4. The floating charge was thus successful at suppressing corrosion.

In yet another experiment, a semiconductor substrate 2 in the shape of a wafer was placed in a beaker of DI water 4 into which ozone gas 6 was bubbled. The same experimental conditions were used in this example as well, except that the semiconductor substrate 2 was attached to an anode of the transformer. Within about ten minutes, the semiconductor substrate corrosion was obvious.

While embodiments of the present invention have been shown and described, various modifications may be made without departing from the scope of the invention. The invention, therefore, should not be limited, except to the following claims, and their equivalents.

What is claimed:

1. A method of cleaning an article having a conductive surface area section comprising the steps of:

immersing the article into a bath;

connecting the surface area section with a source of electrons; and introducing ozone gas into the bath.

2. The method of claim 1, wherein the conductive surface comprises copper.

3. The method of claim 1, wherein the source of electrons is a DC electrical power supply or battery having a voltage of from 1–60 VDC.

4. The method of claim 1, wherein the bath comprises water.

5. The method of claim 1, wherein the conductive surface area section comprises a metal film.

6. A method of cleaning a semiconductor substrate, having a conductive surface film, comprising the steps of:

spraying the semiconductor substrate with water;

contacting the conductive film to a source of electrons; and delivering ozone gas to a surface area of the semiconductor substrate.

7. The method of claim 1, wherein the conductive film comprises copper.

8. The method of claim 1, wherein the water is DI water including one or more chemical additives including corrosion inhibitors, conductive salts and additives to enhance cleaning.

9. The method of claim 1, wherein the conductive film connects to a source of electrons via at least one electrical contact.

10. A method of cleaning organic material from a semiconductor substrate having a conductive film thereon, comprising the steps of:

immersing a semiconductor substrate in water;

electrically connecting the conductive film to a cathode of a DC electrical power source;

electrically connecting an anode of the DC electrical source to a location adjacent to the conductive film; and introducing ozone gas and an electrolyte into the water.

11. A method for cleaning organic material from a semiconductor substrate, the semiconductor substrate including a conductive film thereon, the method comprising the steps of:

spraying a semiconductor substrate with water;

electrically connecting the conductive film to a cathode of a DC electrical power source;

placing an anode of the DC electrical power source adjacent to the conductive film thereon; and providing ozone gas around the conductive film.

12. A method for cleaning an article having a conductive surface area section, comprising the steps of:

contacting the conductive surface area section with a fluid:

connecting the conductive surface area section with a source of electrons; and supplying ozone gas around the conductive surface area section.

* * * * *